(12) United States Patent
Akimoto

(10) Patent No.: US 6,515,731 B1
(45) Date of Patent: *Feb. 4, 2003

(54) SUBSTRATE PROCESSING APPARATUS AND SUBSTRATE PROCESSING METHOD

(75) Inventor: Masami Akimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/559,472

(22) Filed: Apr. 27, 2000

(30) Foreign Application Priority Data

May 6, 1999 (JP) .......................... 11-126104

(51) Int. Cl.$^7$ ..................... G03B 27/32; G03B 27/52; G03D 5/00
(52) U.S. Cl. ..................... 355/27; 355/30; 396/611
(58) Field of Search ..................... 355/27, 30; 430/269, 430/270.1, 300, 302, 401, 935; 396/571, 575, 577, 604, 611, 612, 624

(56) References Cited

U.S. PATENT DOCUMENTS

| | | | | |
|---|---|---|---|---|
| 4,985,722 A | * | 1/1991 | Ushijima et al. | 134/66 |
| 5,051,338 A | * | 9/1991 | Kato et al. | 430/296 |
| 5,620,560 A | * | 4/1997 | Akimoto et al. | 156/345 |
| 5,664,254 A | | 9/1997 | Ohkura et al. | 396/612 |
| 6,292,250 B1 | * | 9/2001 | Matsuyama | 118/52 |
| 6,338,582 B1 | * | 1/2002 | Ueda et al. | 118/52 |
| 6,341,903 B1 | * | 1/2002 | Ueda | 118/52 |

* cited by examiner

Primary Examiner—Rodney Fuller
(74) Attorney, Agent, or Firm—Oblon, Spivak, McClelland, Maier & Neustadt, P.C.

(57) ABSTRACT

A substrate processing apparatus configured to process a substrate by a photolithography process, comprising a plurality of heating sections for heating substrate, respectively, a plurality of first cooling sections, the number of which is equal to or smaller than the number of the heating sections, for cooling the substrate heated in the heating section to a first temperature, a second cooling section for further cooling the substrate cooled in the first cooling section to a second temperature lower than the first temperature, and a plurality of liquid process sections for supplying a process liquid to the substrate cooled in the second cooling section to form a liquid film of the process liquid on the substrate.

15 Claims, 11 Drawing Sheets

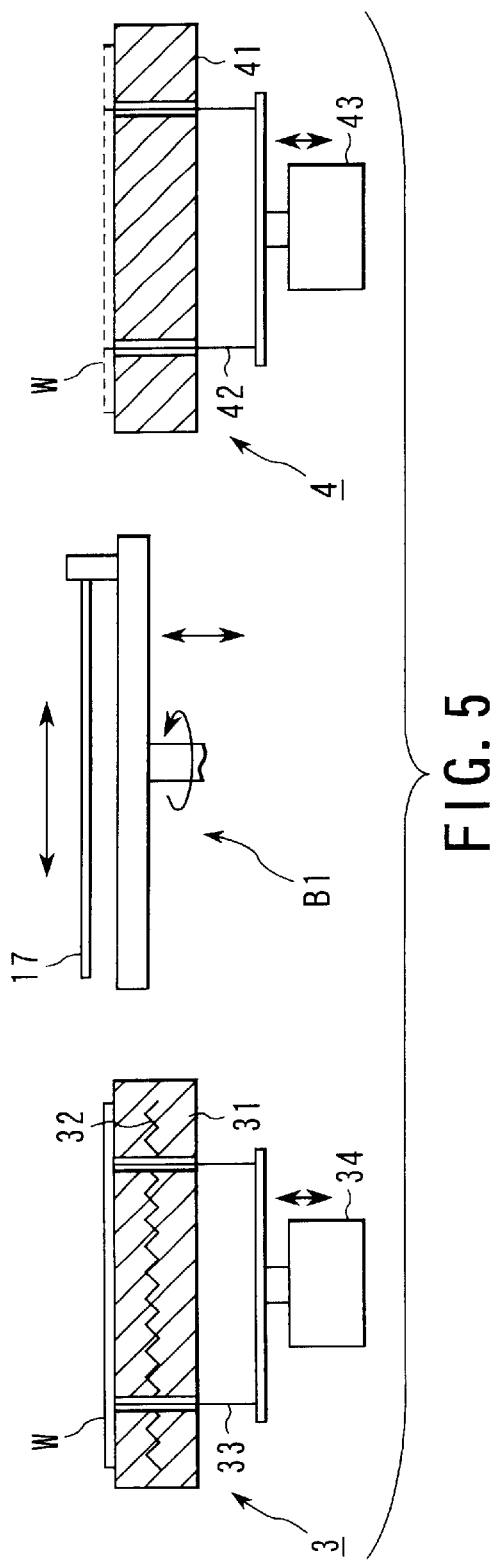
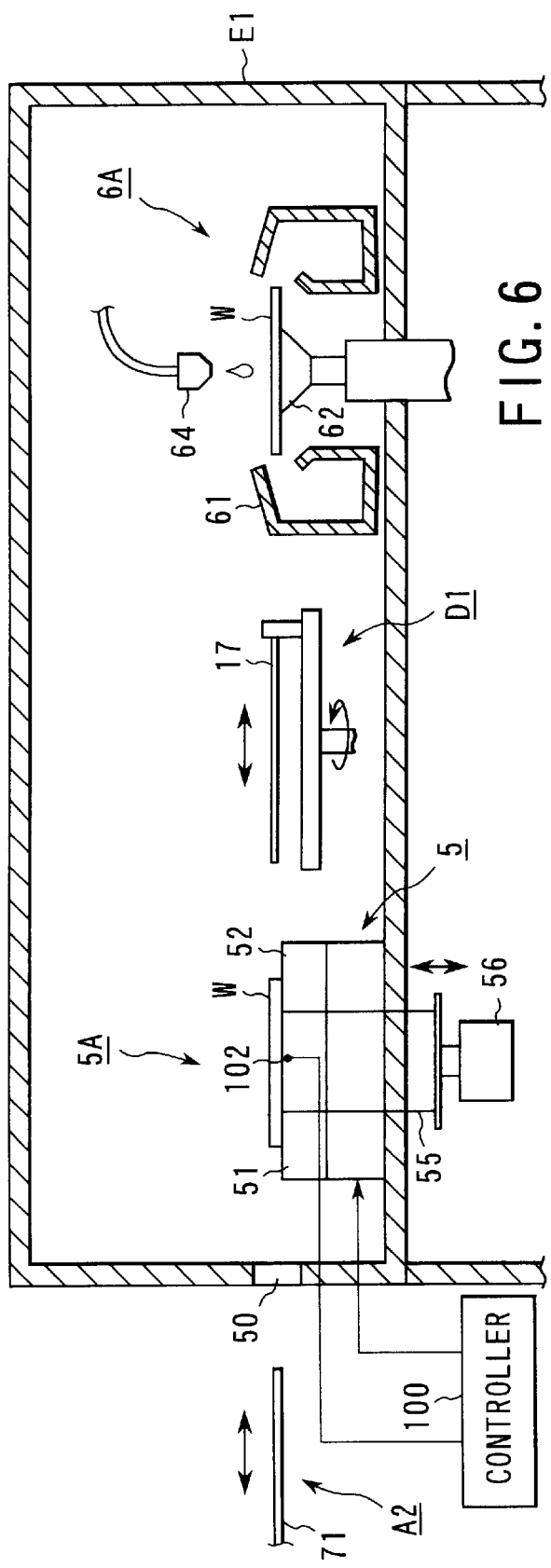
FIG. 5
FIG. 6

SUBSTRATE PROCESSING APPARATUS AND SUBSTRATE PROCESSING METHOD

CROSS-REFERENCE TO RELATED APPLICATIONS

This application is based upon and claims the benefit of priority from the prior Japanese Patent Application No. 11-126104, filed May 6, 1999, the entire contents of which are incorporated herein by reference.

BACKGROUND OF THE INVENTION

The present invention relates to a substrate processing apparatus for applying a series of photolithography process to a substrate such as a semiconductor wafer or a glass substrate for a liquid crystal display device.

A coating-developing system (substrate processing apparatus) disclosed in, for example, U.S. Pat. No. 5,664,254 is used performing a photolithography process applied to a semiconductor device. The developing station included in this system comprises a Chill-Hot-Plate (CHP) unit for Post-Exposure Baking (PEB) a chemically amplified resist film exposed to light in a pattern. The CHP unit includes a hot plate mechanism for heating a wafer, a cooled plate mechanism for cooling the wafer, and a transfer mechanism for transferring the wafer between the hot plat mechanism and the cooled plate mechanism and serves to prevent over-baking of the resist film. To be more specific, the wafer immediately after heated by the hot plate mechanism is transferred to the cooled plate mechanism so as to be cooled promptly to room temperature. As a result, the PEB time is controlled highly accurately so as to prevent effectively the resist film from being over-baked. It follows that a desired resolution can be obtained in the subsequent developing treatment.

In the conventional CHP unit, however, the hot plate mechanism is arranged in the vicinity of the wafer inlet-outlet port, and the cooled plate mechanism is arranged away from the wafer inlet-outlet port and behind the hot plate mechanism relative to the water inlet-outlet port, with the result that the cooled wafer W receives radiation heat from the hot plate when the wafer W is taken out of the CHP unit through the wafer inlet-outlet port. To be more specific, when the cooled wafer W is taken out of the CHP unit through the wafer inlet-outlet port, the wafer W is moved above the hot plate so as to receives radiation heat from the hot plate, resulting in wafer temperature elevation. It follows that it is difficult to maintain highly accurately the temperature of the wafer W delivered to the developing unit.

It should also be noted that, in the conventional apparatus, a plurality of CHP units are stacked one upon the other to form multi-stages, with the result that nonuniformity of temperature is brought about among the wafers processed by the CHP units. On the other hand, since the developing unit to which the wafer taken out of the CHP unit is to be transferred is not determined, the wafer is transferred into a vacant developing unit that is not being used. In other words, wafers of various temperatures are introduced into the developing unit, giving rise to nonuniformity among the wafers in the resolution. If the wafers before the developing treatment are nonuniform in temperature, the developing treatments of the wafers are rendered nonuniform, leading to a low yield.

BRIEF SUMMARY OF THE INVENTION

An object of the present invention is to provide a substrate processing apparatus and a substrate processing method that permit suppressing the nonuniformity in temperature of the substrates before the developing treatment so as to obtain a high yield.

It is conceivable to mount a cooling plate that permits the temperature control with a high precision to each CHP unit in order to prevent nonuniformity in the wafer temperature among the CHP units. However, such a cooling plate is costly, leading to a high apparatus cost. Also, since a hot plate adapted in size to have the wafer mounted thereon, a cooling plate and a transfer mechanism are mounted to the CHP unit, the apparatus is rendered bulky and heavy if a control apparatus for a high precision temperature control is further mounted to the apparatus.

Under the circumstances, the present inventors have conducted extensive research on the parallel PEB processing of a large number of wafers, arriving at the present invention.

According to a first aspect of the present invention, there is provided a substrate processing apparatus for processing a substrate by a photolithography process, comprising:

a plurality of heating sections for heating substrates, respectively;

a plurality of first cooling sections, the number of which is equal to or smaller than the number of the heating sections, for cooling the substrate heated in the heating section to a first temperature;

a second cooling section for further cooling the substrate cooled in the first cooling section to a second temperature lower than the first temperature; and a plurality of liquid process sections for supplying a process liquid to the substrate cooled in the second cooling section to form a liquid film of the process liquid on the substrate.

According to the first aspect of the present invention, the substrate after heating is preliminarily cooled in the first cooling section, followed by further cooling the substrate to the second temperature, making it possible to control the substrate temperature with high precision. As a result, it is possible to suppress the nonuniformity of processing, which is caused by the substrate temperature, in the substrate process section, leading to a high yield.

It is possible for the substrate processing apparatus of the present invention to further comprise a first transfer mechanism for transferring the substrate between the heating section and the first cooling section and a second transfer mechanism for transferring the substrate between the first cooling section and the second cooling section. In this case, the heating time in the heating section can be controlled by the first substrate transfer means.

It is desirable for the liquid process section to comprise a developing section for forming a liquid film of the developing solution on the substrate, and each of the first and second cooling sections should desirably be arranged between the developing section and the heating section. In this case, the developing section is unlikely to be thermally affected by the heating section, making it possible to achieve a developing treatment with high precision.

The second cooling section may be positioned so as to be surrounded by the plurality of liquid process sections such that the cooled substrate may be supplied to each of these liquid process sections. In this case, nonuniformity in the cooling of the substrate does not take place in the second cooling section, leading to a high uniformity of processing.

The second cooling section may be arranged in the vicinity of only one of the plurality of liquid process sections such that the cooled substrate may be supplied to only the liquid process section positioned adjacent to the second cooling section. In this case, even if nonuniformity of the cooling temperature is generated among the plurality of second cooling sections, a liquid film of the process liquid can be formed on the substrate under the conditions conforming with the cooling temperature in the second cooling section, leading to a uniform processing.

It is desirable for the apparatus of the present invention to comprise a third transfer mechanism for transferring the substrate between the second cooling section and the liquid process section. In this case, the second transfer mechanism also serves to transfer the substrate between the second cooling section and the liquid process section.

It is desirable for the liquid process section to comprise a resist coating section for coating a substrate with a resist solution and for the second cooling section to be arranged in the vicinity of the resist coating section.

Further, it is desirable for the apparatus of the present invention to comprise air conditioning means for making the second cooling section and the liquid process section substantially equal to each other in the atmosphere.

According to a second aspect of the present invention, there is provided a substrate processing method for processing the substrate by the use of photolithography process, comprising the steps of:

(a) transferring a substrate into a selected one of a plurality of heating sections for heating the substrate;

(b) transferring the substrate heated in the heating section in the step (a) into a selected one of a plurality of first cooling sections, the number of which is smaller than or equal to the number of the heating sections, for cooling the substrate to a first temperature;

(c) transferring the substrate cooled in the step (b) into a second cooling section for cooling the substrate to a second temperature lower than the first temperature; and (d) transferring the substrate cooled in the step (c) to a liquid process section for forming a liquid film of a process liquid on the substrate.

It is possible to select one of a plurality of liquid process sections in step (d) for transferring the substrate from the second cooling section into the selected liquid process section. On the other hand, it is also possible to transfer in step (d) the substrate from the second cooling section into a specified liquid process section.

It is desirable to set the first temperature at about 40° C. and the second temperature at about 23° C.

It is desirable to supply in the step (d) a developing solution onto the substrate under an atmosphere substantially free from an alkali component.

Further, it is desirable to coat the substrate in the step (d) with a chemically amplified resist under an atmosphere substantially free from an alkali component.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a block diagram schematically showing the heating section, the first cooling section, and the sub-arm mechanism;

FIG. 6 is a block diagram schematically showing the constructions of the second cooling section, the developing unit, and the sub-arm mechanism;

DESCRIPTION OF THE PREFERRED EMBODIMENTS

Various preferred embodiments of the present invention will now be described with reference to the accompanying drawings.

Figure 1:
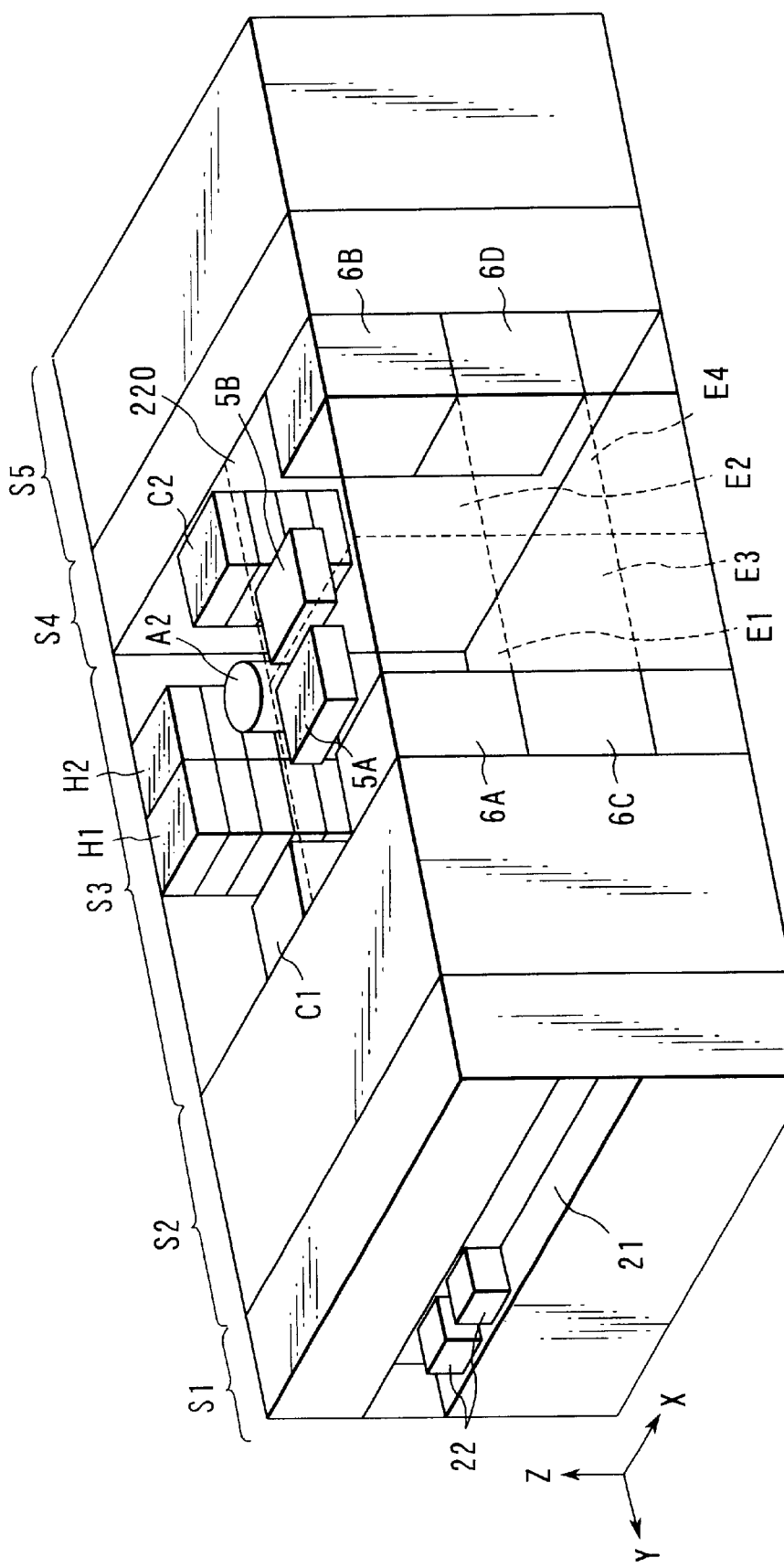
FIG. 1 is a perspective oblique view schematically showing the construction of a substrate processing apparatus according to a first embodiment of the present invention.
Figure 2:
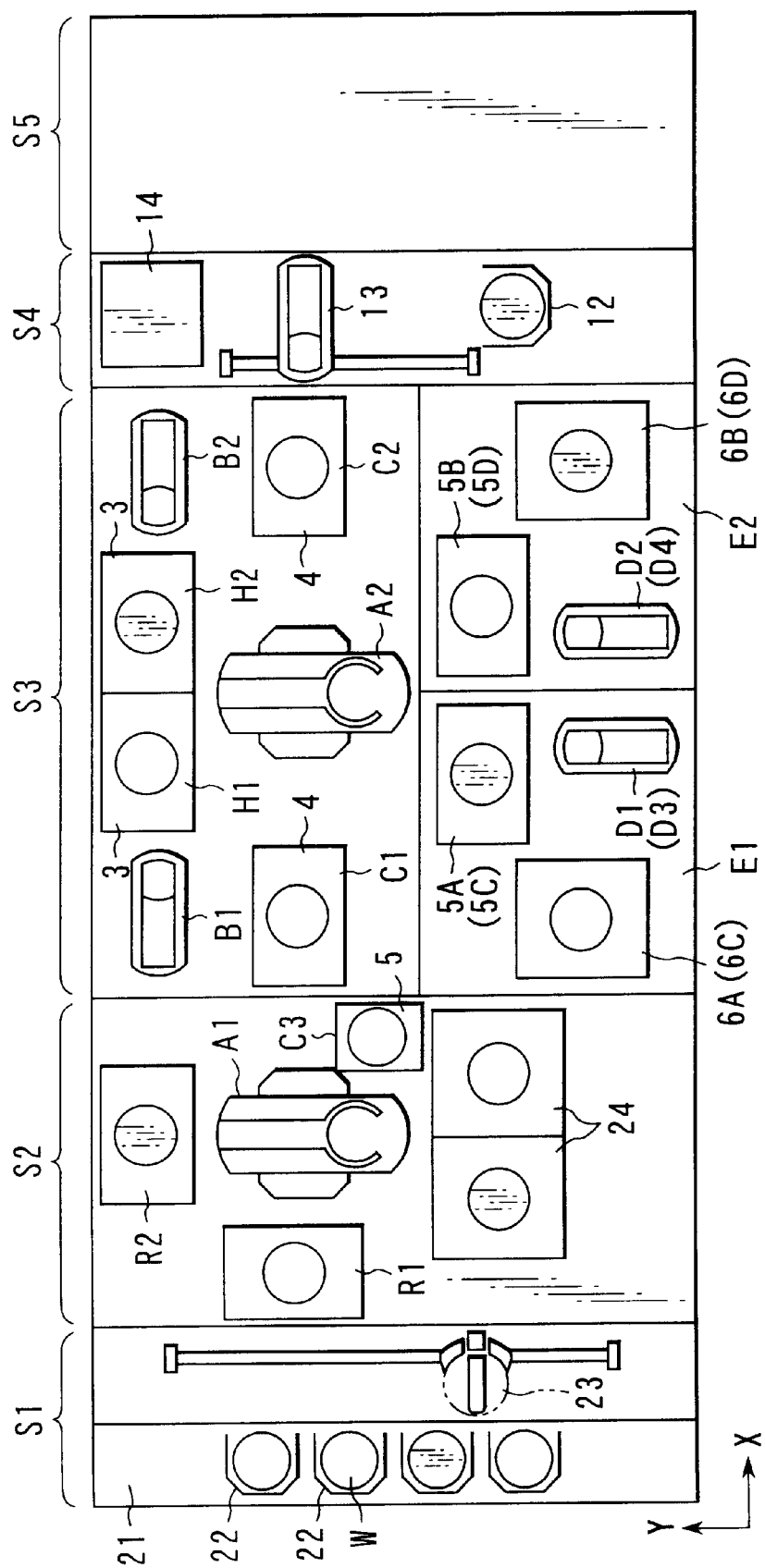
FIG. 2 is a perspective plan view schematically showing the construction of a substrate processing apparatus according to the first embodiment of the present invention.

In a first embodiment of the present invention, the technical idea of the present invention is applied to a resist coating-developing system used in a photolithography process for a semiconductor wafer. As shown in FIGS. 1 and 2, the resist coating-developing system comprises a cassette station S1, a coating station S2, a developing station S3 and an interface station S4. The coating-developing system of the present invention is connected to a light exposure station S5 via the interface station S4. The interface station S4 includes a sub-arm transfer mechanism 13, a buffer cassette 12 and a peripheral light exposure device 14. The sub-arm transfer mechanism 13 serves to deliver a wafer W between the light exposure station S5 and a transfer mechanism (not shown).

The cassette station S1 includes a cassette stage 21 and a sub-arm transfer mechanism 23. Four projections are formed on the upper surface of the cassette stage 21 so as to determine the positions of cassettes 22 arranged on the cassette stage 21.

The sub-arm transfer mechanisms 13 and 23 comprise arm holders 13a and 23a, respectively. Each of these sub-arm transfer mechanisms comprises a back-and-forth driving mechanism (not shown), a Y-axis driving mechanism (not shown), a Z-axis driving mechanism (not shown), and a θ-swing driving mechanism (not shown). These driving mechanisms serve to move the arm holders 13a, 23a back and forth, serve to move these arm holders in the Y- and Z-directions and serve to swing the arm holders about the Z-axis.

The coating station S2 comprises four coating units 24, a cooling section C3, two rack units R1, R2, and a first main arm transfer mechanism A1. These four coating units 24 are arranged on the front side of the system to form two rows each consisting of two coating units 24 superposed one upon the other. The first rack unit R1 is arranged on the side of the cassette station S1, and the second rack unit R2 is arranged on the back side of the system.

The cooling section C3 is arranged in the vicinity of the coating unit 24 such that the wafer W before entering the coating unit 24 is cooled accurately to a target temperature, e.g., 23±0.5° C. To be more specific, the cooling section C3 is arranged as a cooling means belonging exclusively to the coating unit 24 so as to be used in the case where the wafer W is coated with, for example, a chemically amplified resist critically requiring a uniform thickness. The cooling section C3 comprises a cooling plate exchanging heat with the wafer W and with a coolant, an air cooling nozzle (not shown) for blowing a cool air against the wafer W, and a temperature sensor 1021.

Figure 3:
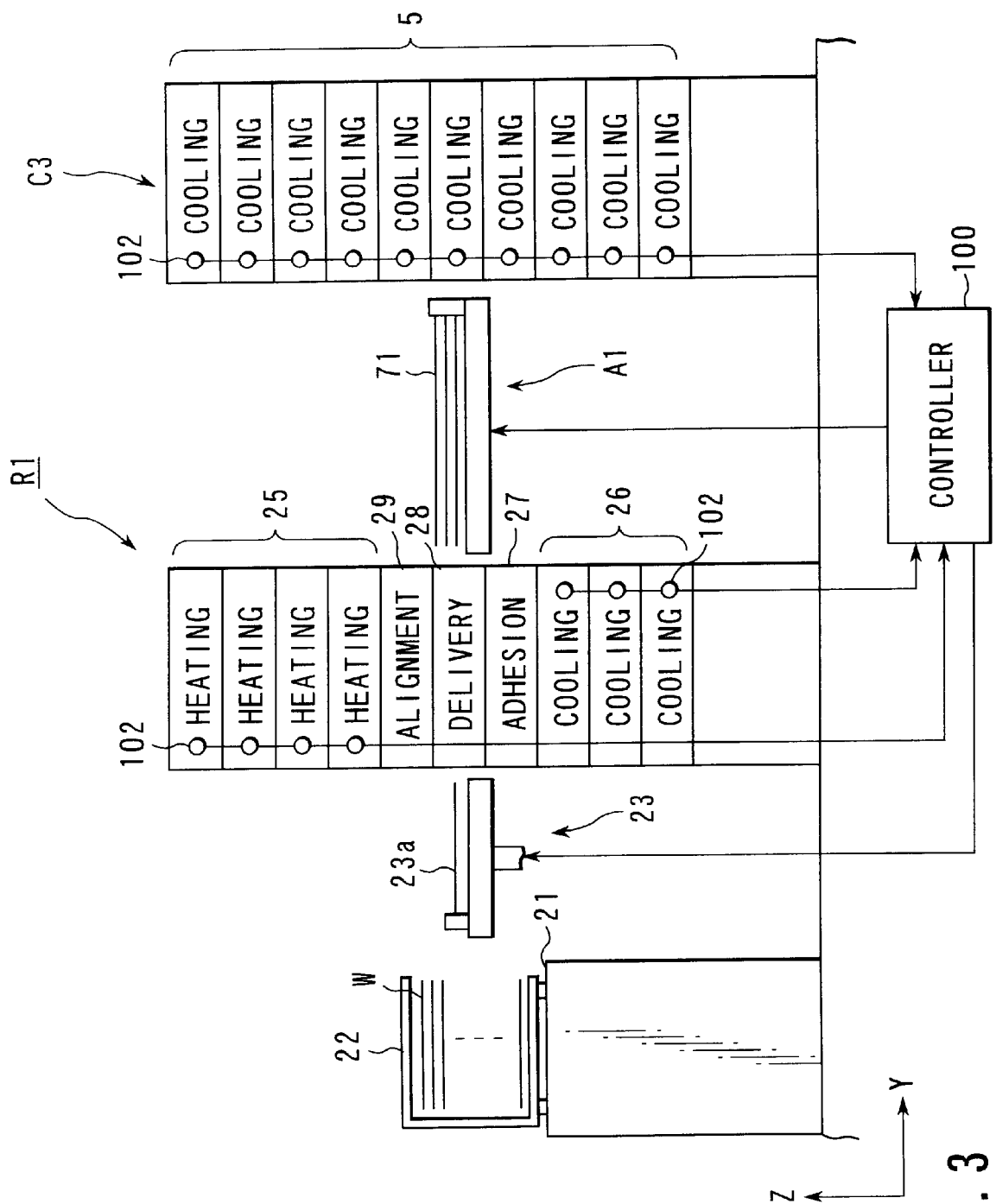
FIG. 3 is a block diagram schematically showing a rack unit, a sub-arm transfer mechanism and a main arm transfer mechanism.

As shown in FIG. 3, each of the first and second rack units R1 and R2 comprises four heating units 25, an alignment unit 29, a delivery unit 28, an adhesion unit 27 and three cooling units 26, which are stacked one upon the other in the order mentioned as viewed from above. Each of the heating units 25 includes a hot plate having a heater arranged therein and a plurality of lift pins. The alignment unit 29 includes a movable stage and serves to align the wafers W. The delivery unit 28 includes a wafer stage through which passes the wafer that is transferred between the sub-arm transfer mechanism 23 and the first main arm transfer mechanism A1. Further, the adhesion unit 27 allows an HMDS vapor to act on the surface of the wafer W under heating so as to improve the adhesivity of the resist solution to the wafer surface.

Each of the cooling units 26 serves to roughly cool the wafer W after the heating to about 40° C. to 35° C. The cooling unit 26 includes a cooling plate exchanging heat with the wafer W and with a coolant and a temperature sensor 102, which is formed of, for example, a thermocouple. The temperature sensor 102, which is buried in the cooling plate, detects the temperature in a surface region of the cooling plate and supplies a signal denoting the detected temperature to an output section of a controller 100. A power source of a coolant supply source is controlled by the controller 100.

As shown in FIG. 2, the first main arm transfer mechanism A1 is arranged in substantially the center of the coating station S2, and the coating units 24, the cooling section C3 and the first and second rack units R1 and R2 are arranged to surround the first main arm transfer mechanism A1. The two rows of the coating units 24 each consisting of two coating units superposed one upon the other are arranged in symmetry in the horizontal direction with respect to the first main arm transfer mechanism A1.

The developing station S3 comprises four developing units 6A, 6B, 6C, 6D, two heating unit groups H1, H2, two first cooling unit groups C1, C2, four second cooling unit groups 5A, 5B, 5C, 5D, a second main arm transfer mechanism A2, two sub-arm transfer mechanisms B1, B2, and four sub-arm transfer mechanisms D1, D2, D3, D4. The developing units 6A, 6B, 6C, 6D are arranged within first to fourth developing chambers E1, E2, E3, E4, respectively. These developing chambers E1, E2, E3, E4 are arranged on the front side of the system. On the other hand, the heating unit groups H1, H2, the first cooling unit groups C1, C2 and the sub-arm transfer mechanisms B1, B2 are arranged on the back side of the system.

Figure 4:
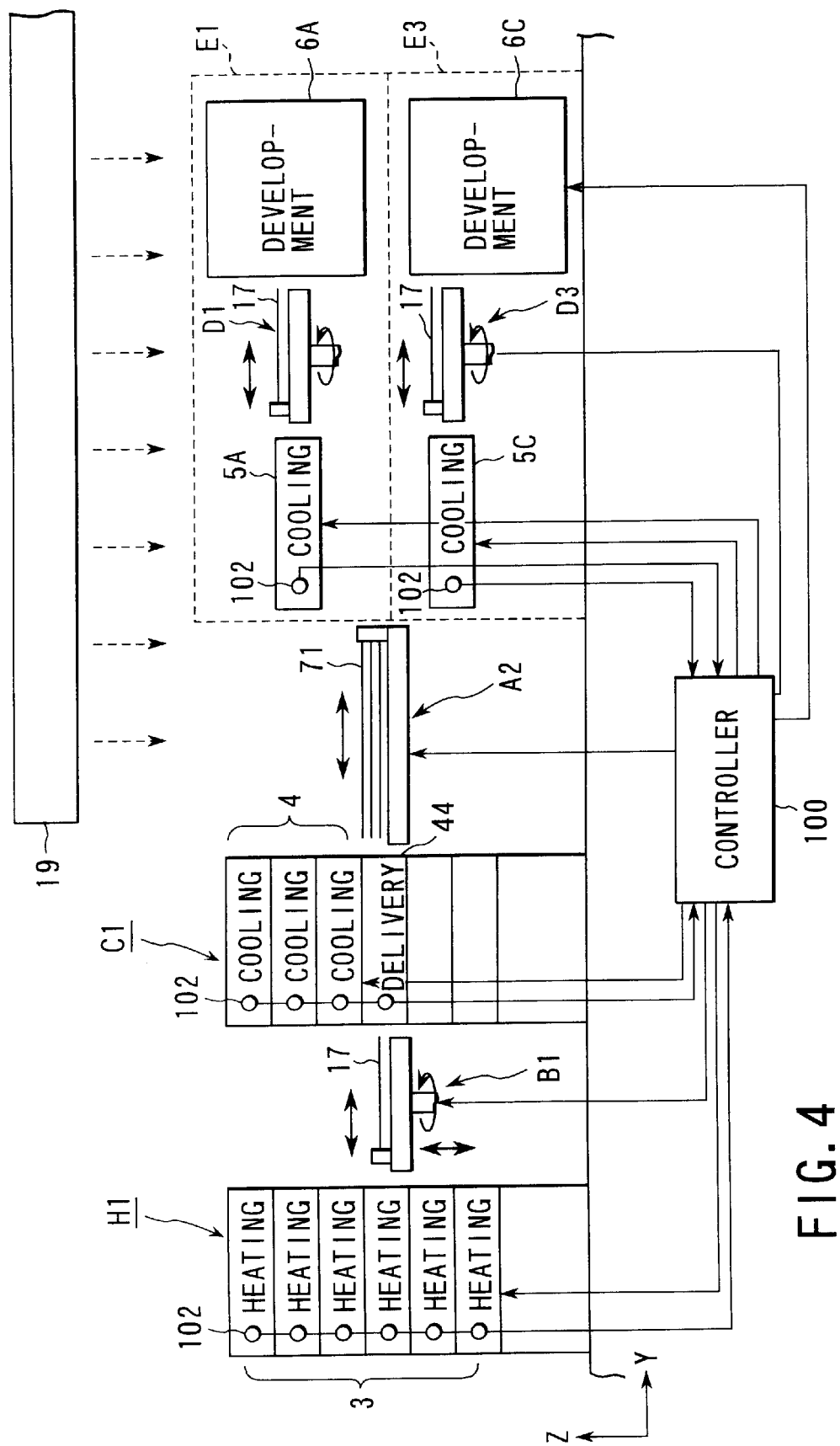
FIG. 4 is a block diagram schematically showing the developing station, the heating section, the cooling section, the sub-arm transfer mechanism and the main arm transfer mechanism.

As shown in FIG. 4, the first developing chamber E1 and the third developing chamber E3 are stacked one upon the other. Likewise, the second developing chamber E2 and the fourth developing chamber E4 are stacked one upon the other. The exclusive cooling sections 5A, 5B, 5C, 5D and the exclusive sub-arm transfer mechanisms D1, D2, D3, D4 are arranged within the developing chambers E1, E2, E3, E4, respectively.

The second cooling sections 5A, 5B, 5C, 5D serve to cool highly accurately the wafers W immediately before entering the developing chambers E1, E2, E3, E4, respectively, to a target temperature of, for example, 23±0.5° C. As shown in FIG. 6, each of the second cooling sections 5A, 5B, 5C and 5D includes a temperature control plate 51, a cooling plate 52 exchanging heat with the wafer W and with a coolant, a cooling air nozzle for blowing a cooling air against the wafer W, and the temperature sensor 102. Incidentally, the power source for the coolant supply source and the power source for the cooling air supply source are controlled by the controller 100.

As shown in FIGS. 2 and 4, the sub-arm transfer mechanism B1 is arranged between the heating section 3 (H1) and the cooling section 4 (C1). Also, the other sub-arm transfer mechanism B2 is arranged between the heating section 3 (H2) and the cooling section 4 (C2). These sub-arm transfer mechanisms B1 and B2 are arranged in symmetry in the horizontal direction with respect to the main arm transfer mechanism A2. Also, these heating sections H1 and H2 are arranged in symmetry in the horizontal direction with respect to the main arm transfer mechanism A2. Further, these cooling sections C1 and C2 are arranged in symmetry in the horizontal direction with respect to the main arm transfer mechanism A2. Each of these sub-arm mechanisms B1 and B2 includes an arm holder 17, a back-and-forth driving mechanism (not shown), a Y-axis driving mechanism (not shown), a Z-axis driving mechanism (not shown), and a θ-swing driving mechanism (not shown). These driving mechanisms serve to move the arm holder 17 back and forth, serve to move the arm holder 17 in the Y- and Z-directions and serve to swing the arm holder 17 about the Z-axis.

Each of the heating groups H1 and H2 includes six heating sections 3 superposed one upon the other. Each heating section 3 includes a hot plate having a heater arranged therein, a plurality of lift pins, and the temperature sensor 102, which consists of, for example, a thermocouple. The temperature sensor 102, which is buried in a hot plate, detects the temperature in a surface region of the hot plate and supplies a signal denoting the detected temperature to the output section of the controller 100. Incidentally, the heater power source is controlled by the controller 100.

Each of the cooling groups C1 and C2 includes three first cooling sections 4 and a delivery section 44. The first cooling section 4 serves to roughly cool the wafer W after the heating to, for example, 40° C. to 35° C. Incidentally, the first cooling section 4 includes a cooling plate exchanging heat with the wafer W and with a coolant and the temperature sensor 102, which is formed of, for example, a platinum temperature-measuring resistor. The temperature sensor 102, which is buried in a cooling plate, detects the temperature in a surface region of the cooling plate and supplies a signal denoting the detected temperature to the output section of the controller 100. Incidentally, the power source of the coolant supply source is controlled by the controller 100.

The second main arm transfer mechanism A2 includes a plurality of arm holders 71, a back-and-forth driving mechanism (not shown), a Z-axis driving mechanism (not shown), and a θ-swing driving mechanism (not shown). These driving mechanisms serve to drive the arm holders 71 back and forth, serve to drive the arm holders 71 in the Z-axis direction, and serve to swing the arm holders 71 around the Z-axis. The second main arm transfer mechanism A2 is substantially equal to the first main arm transfer mechanism A1 described previously.

Figure 9:
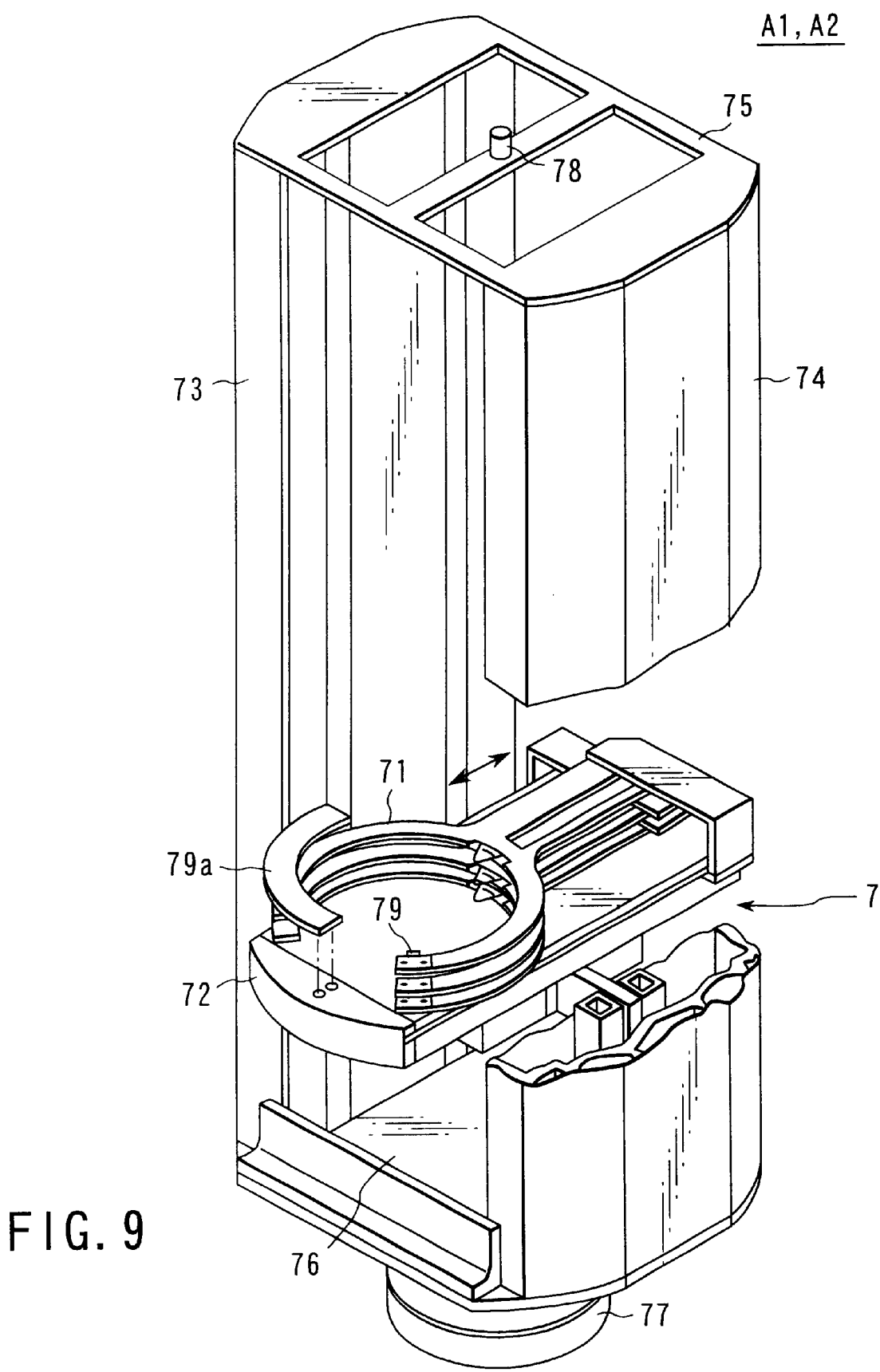
FIG. 9 is an oblique view, partly broken away, showing the main arm transfer mechanism.

As shown in FIG. 9, each of the first and second main arm transfer mechanisms A1 and A2 includes an arm holder 71, a base plate 72, a pair of guide rails 73, 74, joining members 75, 76, a motor 77, and a rotary shaft portion 78. The arm holder 71 is supported by the base plate 72 such that the arm holder 71 is movable back and forth. The base plate 72 is vertically movable along the guide rails 73, 74. The upper ends of these guide rails 73, 74 are joined to each other by the joining member 75. Likewise, the lower ends of these guide rails 73, 74 are joined to each other by the joining member 76. It follows that these guide rails 73, 74 and joining members 75, 76 collectively form a frame body. The frame body is supported by the rotary shaft portion 78 such that the frame body is swingable about the Z-axis. If the frame body is swung about the rotary shaft 78 by the motor 77, the arm holder 71 is allowed to face in a desired direction.

The arm holder 71 is of a three stage structure constructed such that the wafer W can be held by each stage. To be more specific, the periphery of the wafer W is disposed on, for example, a claw portion 79 included in each stage of the arm holder 71. The proximal end portion of the arm holder 71 can be slid along a guide groove 70 extending in a longitudinal direction of the base plate 72. The back-and-forth sliding movement of the arm holder 71 is controlled by a driving means (not shown). Also, the vertical movement of the base plate 72 is controlled by another driving means (not shown). Incidentally, a reference numeral 79a denotes a sensor supporting member for mounting an optical sensor serving to detect the presence of the wafer W on the arm holder 71. The sensor supporting member 79a is fixed to the base plate 72.

As shown in FIG. 4, the delivery section 44 is included in each of the cooling unit groups C1 and C2. The wafer W is delivered between the second main arm transfer mechanism A2 and the sub-arm transfer mechanism B1 through the delivery section 44.

Clean air is supplied from an upper fan filter unit (FFU) 19 into the entire region of the developing station S3. Also, the atmospheres within the developing units 6A, 6B, 6C and 6D are individually controlled by air conditioners (not shown). The FFU 19 includes a chemical filter for removing traces of the alkali components present in the air. The particular FFU 19 is arranged not only in an upper region of each of the developing station S3 but also in an upper region of each of the interface unit S4 and the light exposure station S5.

As shown in FIG. 5, the heating section 3 includes a hot plate 31, a heater 32, a plurality of lift pins 33 and a vertically movable cylinder 34. The heater 32, which is buried in the hot plate 31, is connected to a power source (not shown) that is controlled by the controller 100. The lift pins 33 are supported by the movable portion of the vertically movable cylinder 34 and inserted into through-holes of the hot plate 31. On the other hand, the first cooling section 4 includes a cooling plate 41, a plurality of lift pins 42 and a vertically movable cylinder 43. An inner fluid passageway is formed within the cooling plate 41, and a coolant is supplied from a supply source into the inner fluid passageway.

The developing apparatus will now be described with reference to FIGS. 4, 6 and 7.

As shown in FIG. 6, an inlet-outlet port 50 is formed through the side wall of the developing chamber E1. The wafer W held by the arm holder 71 is inserted into and taken out of the developing chamber E1 through the inlet-outlet port 50. The second cooling section 5A is arranged on the side of the inlet-outlet port 50. On the other hand, the developing unit 6A is arranged apart from the inlet-outlet port 50.

The second cooling section 5A includes a temperature control plate 51, a cooling plate 52, a plurality of lift pins 55, a vertically movable cylinder 56, and the temperature sensor 102. A heater and a coolant passageway are arranged within the temperature control plate 51. The cooling plate 52, which is formed of, for example, an aluminum plate, is disposed on the temperature control plate 51.

In the second cooling section 5A of the particular construction, the temperature on the surface of the cooling plate 52 is detected by the temperature sensor 102, and the temperature of the temperature control plate 51 is controlled by the controller 100 on the basis of a signal denoting the detected temperature. Then, the wafer W is disposed on the cooling plate 52, and the temperature of the cooling plate 52 is controlled by the temperature control plate 51. As a result, the wafer W is cooled to the second temperature lower than the first temperature.

Figure 8:
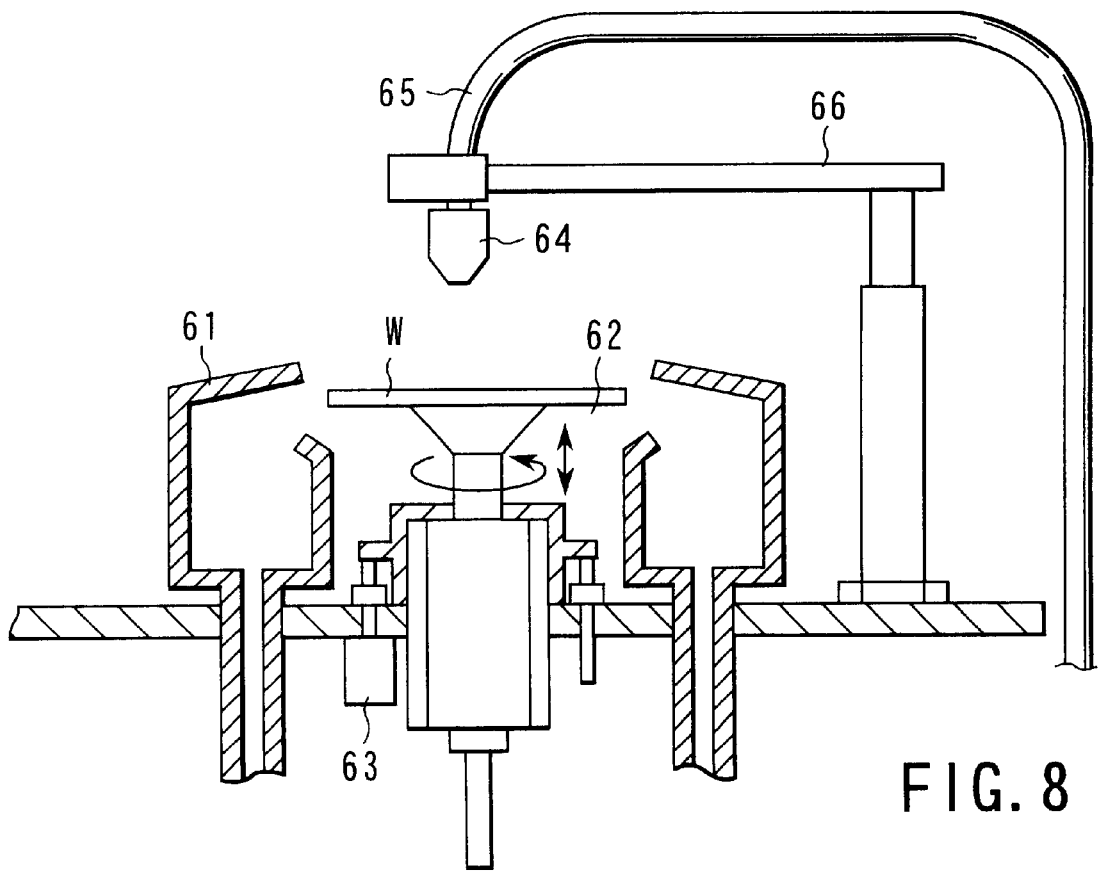
FIG. 8 is a perspective cross sectional view showing the developing unit.

As shown in FIG. 8, the developing unit 6 includes a cup 61, a spin chuck 62, and a nozzle 64. The spin chuck 62 is supported vertically movable by a cylinder mechanism 63. The nozzle 64, which is of a linear type and includes a large number of liquid discharge holes, communicates with a developing solution supply source through a supply pipe 65. Further, the nozzle 64 is movably supported by a horizontal arm 66. Incidentally, the coating unit 24 is similar in construction to the developing unit 6.

Figure 7:
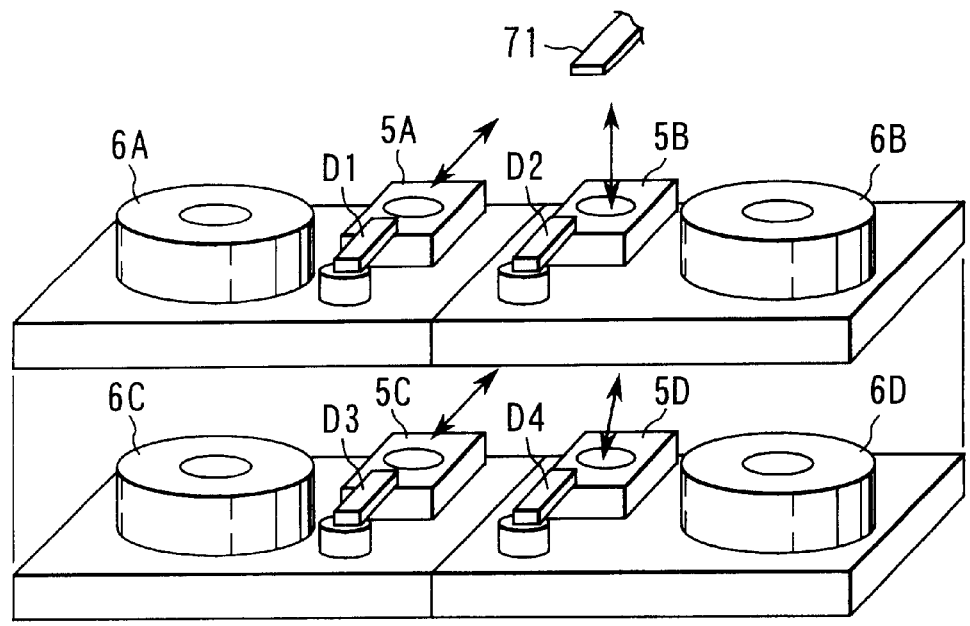
FIG. 7 is an oblique view schematically showing the second cooling section and the developing unit.

As shown in FIG. 7, the sub-arm transfer mechanism D1 is arranged within the developing chamber E1 so as to carry out delivery of the wafer W between the first cooling section 5A and the developing unit 6A. The other developing chambers E2, E3 and E4 are also constructed similarly.

The sub-arm transfer mechanism B1 (B2) is capable of getting access to all the heating sections 3 belonging to the heating unit H1 (H2), to all the first cooling sections 4 belonging to the cooling unit C1 (C2), and to the delivery section 44. As a result, the main arm transfer mechanism A2 permits the wafer W to be transferred into and taken out of each of the heating units H1, H2 and the cooling units C1, C2. Likewise, the transfer arms D1, D2, D3 and D4 permit the wafer W to be transferred into and taken out of the second heating sections 5A, 5B, 5C, 5D and the developing units 6A, 6B, 6C, 6D, respectively.

Figure 10:
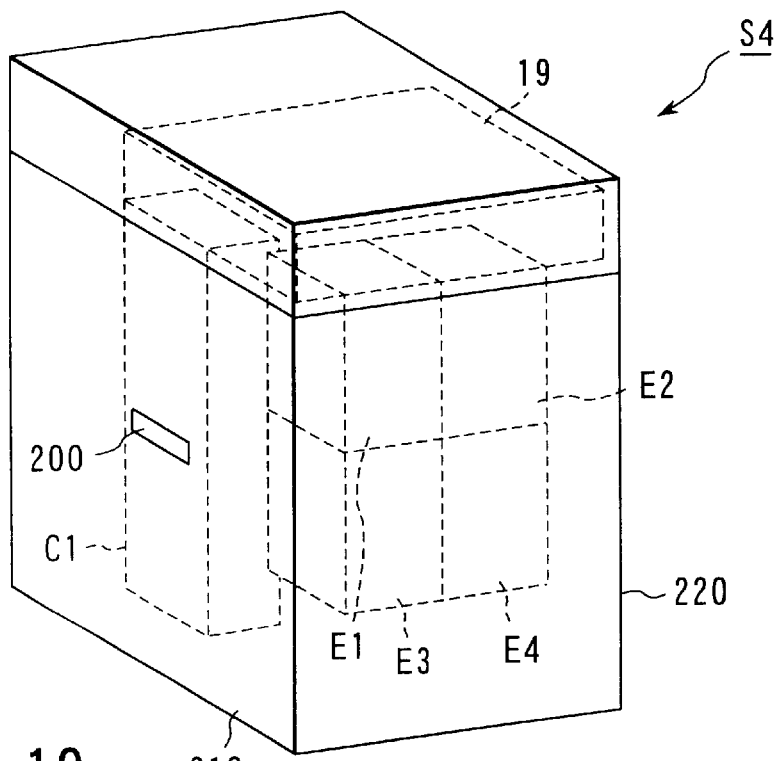
FIG. 10 is an oblique view schematically showing the entire developing station.

Further, the developing station S2 is partitioned from each of the coating station S2 and the interface station S4. Specifically, a partition wall 210 is mounted between the developing station S3 and the coating station S2, as shown in FIGS. 1 and 10. Also, another partition wall 220 is mounted between the developing station S3 and the interface station S4. A delivery port 200 is formed in the partition wall 210. The wafer W is transferred into and taken out of the developing station S3 through the delivery port 200. Incidentally, the FFU 19 is mounted to cover the entire developing station S3.

The FFU 19 includes a filter for removing particles, a chemical filter for removing alkali components such as ammonia and amines contained in the air, a fan, a heating mechanism, and a humidifying mechanism. The air is cleaned by the FFU 19, and the air controlled at a predetermined temperature and a predetermined humidity is forwarded downward into a processing space. For example, in the case of using a chemically amplified resist solution, it is necessary to prevent the alkali component from entering the atmosphere of the developing treatment. Therefore, the closed space is formed within the developing station S3, and a chemical filter is used for preventing the alkali component from entering the developing station from the outside.

The operation of the apparatus described above will now be described.

In the first step, a cassette 22 housing, for example, 25 wafers W is disposed on the stage 21 by an automatic transfer robot or by the operator. The wafer W is taken out of the cassette 22 by the sub-arm transfer mechanism 23 so as to be disposed on the delivery section 28 of the rack unit R1 included in the coating station S2. Then, the first main arm transfer mechanism A1 transfers the wafer W into the adhesion section 27. Within the adhesion section 27, an HMDS vapor is allowed to act on the wafer W under heating so as to make the surface of the wafer W hydrophobic.

In the next step, the first main arm transfer mechanism A1 transfers the wafer W into the cooling section 26 of rack unit R1 or R2 for roughly cooling the wafer W to about 40° C. (first temperature). Then, the first main arm transfer mechanism A1 transfers the wafer W into the cooling section 5 of the cooling unit C3 for precisely cooling the wafer W to 23±0.5° C. (second temperature). Further, the first main arm transfer mechanism A1 transfers the wafer W into the coating unit 24 for coating the wafer W with a chemically amplified resist solution. Still further, the first main arm transfer mechanism A1 transfers the wafer W into the heating section 25 of the rack unit R1 or R2 for baking the wafer W at a predetermined temperature. Incidentally, in the case of using a resist other than the chemically amplified resist such as a novolak series resist as a coating material, it is possible to omit the precise cooling of the wafer W to the second temperature, which is carried out in the cooling section 5 of the cooling unit C3.

Then, the first main arm transfer mechanism A1 transfers the wafer W into the delivery section 44 of the unit C1 included in the developing station S3, followed by delivering the wafer W onto the second main arm transfer mechanism A2. Upon receipt of the wafer W, the second main arm transfer mechanism A2 transfers the wafer W into the delivery section 44 of the unit C2. Then, the sub-arm transfer mechanism 13 of the interface station S4 takes the wafer W out of the delivery section 44 and, then, transfers the wafer W into the delivery section (not shown) of the light exposure station S5. A transfer mechanism (not shown) transfers the wafer W onto the light exposure stage for selectively exposing the resist film formed on the wafer W to light in a predetermined pattern.

After the light exposure, the wafer W is successively transferred through the light exposure station S5, the interface station S4, the sub-arm transfer mechanism 13, the delivery section 44 of the unit C2, and the second main arm transfer mechanism A2 in the order mentioned. Then, the second main arm mechanism A2 transfers the wafer W to the heating section 3 of the unit H1 or H2 for baking (PEB) the wafer W at a suitable temperature falling within a range of, for example, between 100° C. and 150° C. for a predetermined time.

In the next step, the exclusive sub-arm transfer mechanism B1 (B2) takes the wafer W out of the heating section 3 at a predetermined timing so as to transfer the wafer W into the first cooling section 4 of the unit C1 (C2). In this step, the wafer W is transferred into the sub-arm transfer mechanism B1 (B2) at the timing conforming with the heating time within the heating section 3, the resist film formed on the wafer W is prevented from being over-baked in the PEB step. In the first cooling section 4, the wafer W is disposed on, for example, the cooling plate 41 maintained at a predetermined temperature for a predetermined time. As a result, the wafer W is cooled to the first temperature not higher than, for example, 40° C.

Further, the second main arm transfer mechanism A2 takes the wafer W out of the cooling section 4 at a predetermined timing and puts the wafer W into the cooling section 5. In this case, since the wafer W is transferred onto the second main arm transfer mechanism A2 at the timing conforming with the cooling time within the first cooling section 4, the cooling time of the wafer W is precisely controlled.

The wafer W is cooled within the second cooling section 5 to the second temperature lower than the first temperature, e.g., cooled to 23±0.5° C. Since the temperature of the cooling plate 52 is controlled by the temperature controlling plate 51, the wafer W is controlled precisely to reach the second temperature. Incidentally, the wafer W may be transferred into any one of the heating units H1 and H2 in the developing station S3.

In the next step, the wafer is successively transferred through the sub-arm transfer mechanism D1 (D2, D3, D4), the second cooling section 5, the second main arm transfer mechanism A2, the delivery section 44 of the unit C1, the first main arm transfer mechanism A1, the delivery section 28 of the rack unit R1 and the cassette 22 in the order mentioned. In this case, it is possible to superpose, for example, the second cooling section 5 and a delivery section (not shown) one upon the other and return the wafer W into the cassette 22 through the developing unit 6, the sub-arm transfer mechanism D1, the delivery section 44, the second main arm transfer mechanism A2, the delivery section 44 of the cooling unit C1 and the first main arm transfer mechanism A1 in the order mentioned.

According to the embodiment described above, the wafer W before the development is sequentially subjected to the heat treatment independently in the heating unit H1 (H2), the first cooling section 4 of the cooling unit C1 and the second cooling section 5. As a result, accuracy in the lowering of the wafer temperature is not possible to obtain. Since the temperature of the wafer W is not changed before the developing step so as to make it possible to carry out the developing treatment while keeping the temperature of the wafer W at a predetermined level, it is possible to suppress the nonuniform development that is caused by the change in the wafer temperature and, thus, to ensure a high yield.

Also, according to the embodiment described above, the wafer W heated in the heating section 3 is roughly cooled to the first temperature in the first cooling section 4, followed by precisely cooling the wafer W to the second temperature lower than the first temperature in the second cooling section 5. Finally, the wafer W is maintained at a predetermined temperature in the second cooling section 5 performing a highly precise temperature control. Therefore, even if a plurality of second cooling sections 5 are arranged, the temperature of the wafer W is accurately maintained at the predetermined temperature so as to suppress nonuniformity in the temperature of the wafer W. As a result, nonuniform development is suppressed so as to improve the yield.

It should also be noted that the developing unit 6 and the second cooling section 5 are arranged to correspond to each other. It follows that, even if nonuniformity of temperature has taken place among the wafers W cooled in the second cooling section 5, the developing temperature can be controlled in accordance with the temperature of the wafer W so as to improve the uniformity of the development and, thus, the yield is not lowered.

Further, the first cooling section 4 and the second cooling section 5 are used in combination for the cooling treatment so as to control highly precisely the temperature drop of the wafer W to a predetermined level without prolonging the time required for the cooling treatment, thereby increasing the through-put. In other words, since it suffices for the first cooling section 4 to cool the wafer W to a temperature lower than the first temperature, the cooling can be performed in a manner to increase the cooling rate such that the cooling rate is more important than the precision of the cooling. On the other hand, it suffices for the second cooling section 5 to cool the wafer W from the temperature lower than the first temperature to the second temperature. In other words, the cooling degree (or the temperature difference) achieved in the second cooling section 5 is small. As a result, a long cooling time is not required even if the cooling is performed while precisely controlling the temperature.

It should also be noted that, in the embodiment described above, the second cooling section 5 and the developing unit 6 are arranged within the same process chamber E. In other words, the second cooling section 5 and the developing unit 6 are put under the same atmosphere into which the air conditioned at a predetermined temperature is supplied through the filter unit F. Since the temperature of the atmosphere within the process chamber is controlled, the temperature control can be performed easily within the second cooling section 5.

Incidentally, if a cooling plate capable of precisely controlling the temperature is mounted to the conventional CHP apparatus in an attempt to suppress generation of the nonuniformity in the heat treating temperature among the CHP apparatuses, the apparatus cost is markedly increased. Also, where the temperature control is performed by a single cooling plate, the cooling time is considerably prolonged, leading to a low through-put because the temperature difference to be controlled is large.

Another embodiment will now be described with reference to FIGS. 11 to 14.

Figure 11:
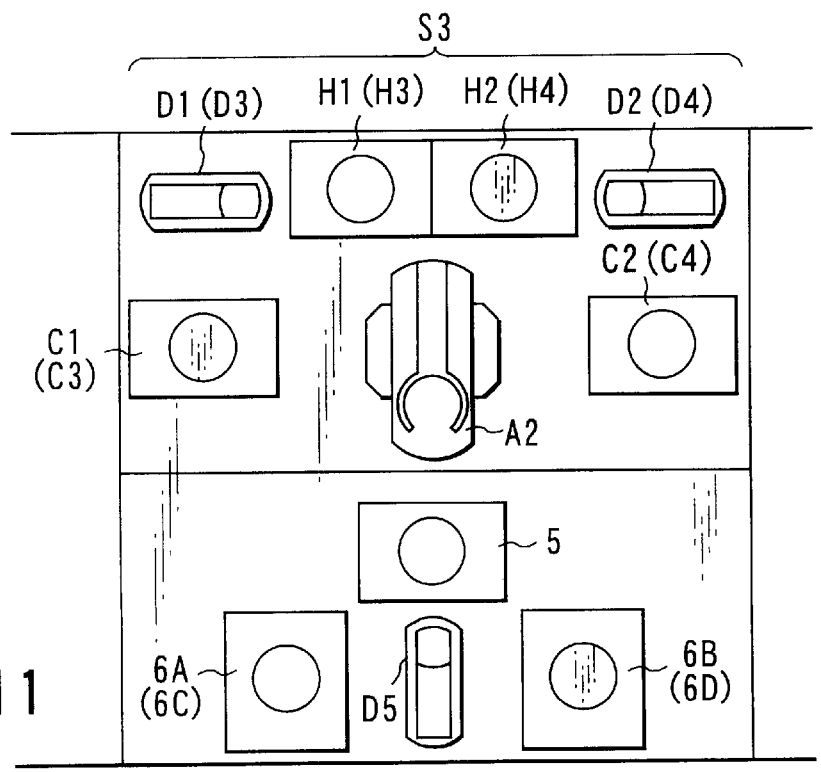
FIG. 11 is a perspective plan view showing the inner construction of a substrate processing apparatus according to another embodiment of the present invention.

In the apparatus shown in FIG. 11, the second cooling section 5 and the sub-arm transfer mechanism D5, which are commonly used, are added to a plurality of the developing units 6. To be more specific, in the apparatus of this embodiment, the second cooling section 5 is arranged for common use in the four developing units 6A, 6B, 6C, 6D. Also, the common subarm transfer mechanism D5 is arranged for the delivery of the wafer W between the developing unit 6 and the second cooling section 5. The common sub-arm transfer mechanism D5 is used as a third substrate transfer mechanism.

The second main arm transfer mechanism A2 and the common sub-arm transfer mechanism D5 are arranged in substantially the center of the developing station S3. The second main arm transfer mechanism A2 is surrounded by the heating units H1, H2, the cooling units C1, C2, the second cooling section 5 and the common sub-arm transfer mechanism D5. On the other hand, the common sub-arm transfer mechanism D5 is surrounded by the four developing units 6A, 6B, 6C, 6D, the second cooling section 5 and the second main arm transfer mechanism A2.

Also, the developing unit 6, the second cooling section 5 and the sub-arm transfer mechanism D5 are arranged within the same chamber. The wafer W is delivered between the second main arm transfer mechanism A2 and the second cooling section 5 through an inlet-outlet port (not shown) formed in the side wall of the chamber. The sub-arm transfer mechanism D5 is substantially equal in construction to the other sub-arm transfer mechanisms.

In this embodiment, the wafer W is heated in the heating section 3 and, then, cooled to a temperature lower than the first temperature in the first cooling section 4. Then, the wafer W is transferred by the second main arm transfer mechanism A2 from the first cooling section 4 into the second cooling section 5 so as to be cooled to the second temperature. Then, the sub-arm transfer mechanism D5 transfers the wafer W into the vacant developing unit 6 for developing the resist film formed on the wafer W. Further, the wafer W is returned to the cassette 22 through the second cooling section 5, the main transfer arm mechanism A2 and the coating station.

According to this embodiment, the second cooling section 5 alone is used, and, thus, nonuniformity of processing within the second cooling section 5 does not take place. It follows that the wafer W of the same temperature can be transferred into the developing unit 6 so as to improve the uniformity of the developing treatment.

It should also be noted that, according to this embodiment, the single second cooling section 5 and the single sub-arm transfer mechanism D5 are commonly used in a plurality of the developing units 6A to 6D so as to markedly diminish the foot print of the apparatus.

Figure 12:
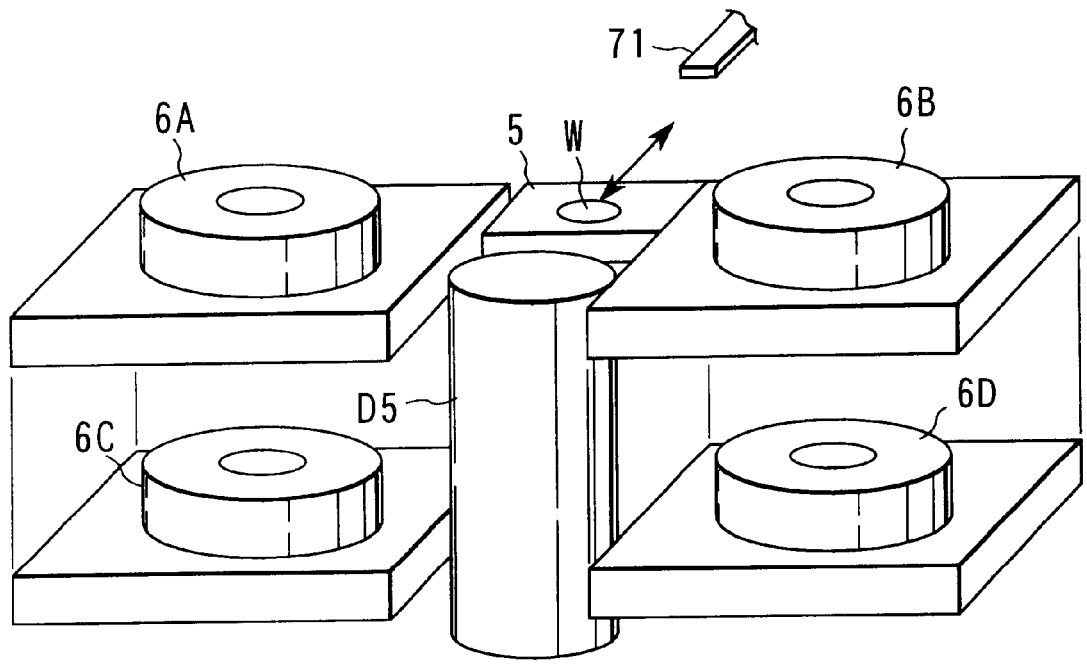
FIG. 12 is an oblique view schematically showing the second cooling section and the developing unit of the developing station.
Figure 13:
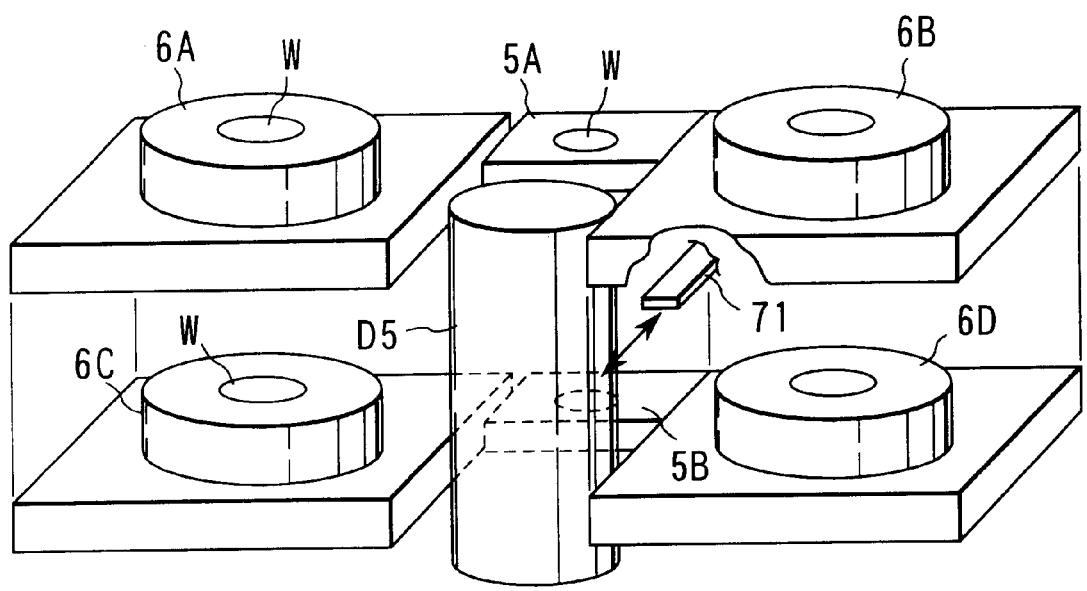
FIG. 13 is an oblique view schematically showing the second cooling section and the developing unit of the developing station included in an apparatus according to another embodiment of the present invention.
Figure 14:
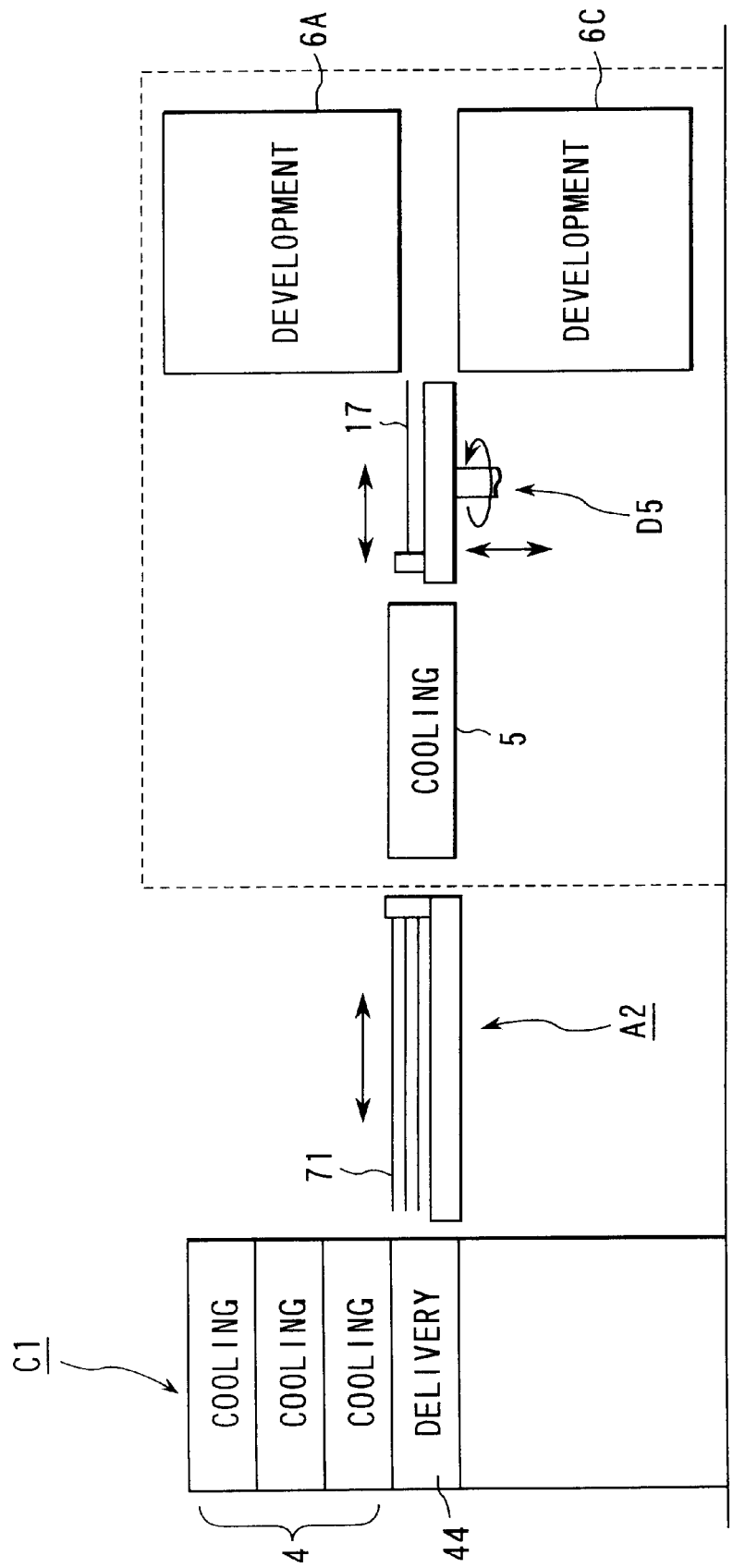
FIG. 14 is a block diagram schematically showing the developing station, the second cooling section, the sub-arm transfer mechanism and the main arm transfer mechanism included in an apparatus according to another embodiment of the present invention.

Incidentally, it is possible to use a single second cooling section 5 as shown in FIG. 12. Alternatively, a plurality of second cooling sections 5 can be used as shown in FIG. 13.

Figure 15:
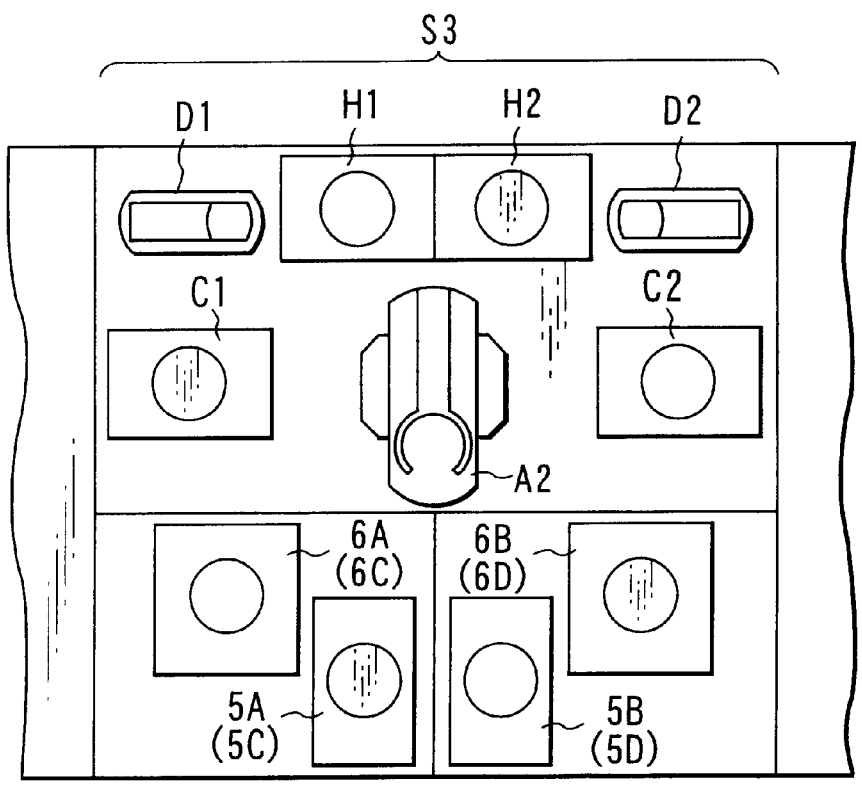
FIG. 15 is a plan view schematically showing the developing station included in an apparatus according to still another embodiment of the present invention.
Figure 16:
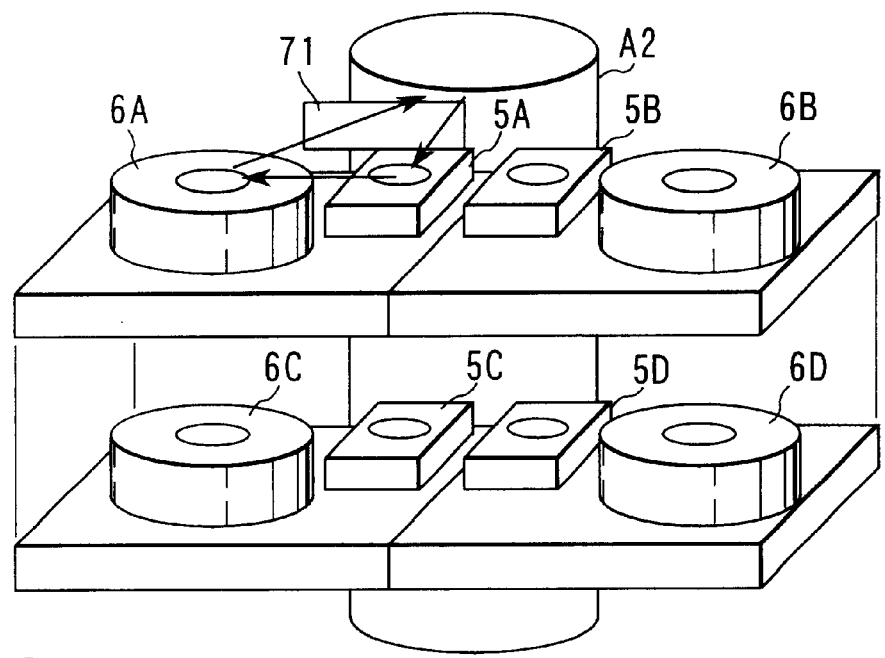
FIG. 16 is an oblique view schematically showing the second cooling section and the developing unit included in the developing station shown in FIG. 15.

A still another embodiment (third embodiment) of the present invention will now be described with reference to FIGS. 15 and 16.

The apparatus of the third embodiment differs from the apparatus of the second embodiment described above in that the second main arm transfer mechanism A2 is used for the delivery of the wafer W between the developing unit 6 and the second cooling section 5 in the third embodiment. To be more specific, the heating units H1, H2, the cooling units C1, C2, the second cooling sections 5A to 5D, and the developing units 6A to 6D are arranged to surround the second main arm transfer mechanism A2 in the third embodiment, as shown in FIG. 15. It should be noted that the developing units 6A to 6D and the second cooling sections 5A to 5D are arranged to correspond to each other, respectively.

In the third embodiment described above, the wafer W is heated in the heating section 3 and, then, cooled to a temperature lower than the first temperature in the first cooling section 4. Further, the wafer W is transferred by the second main arm transfer mechanism A2 from the first cooling section 4 into the second cooling section 5 so as to be cooled to the second temperature. Still further, the wafer W is transferred by the second main arm mechanism A2 to the developing unit 6 corresponding to the cooling section 5 so as to be subjected to a developing treatment. The wafer W after these treatments is delivered from the developing unit 6 directly onto the second main arm transfer mechanism A2 so as to be returned finally to the cassette 22.

According to the third embodiment, the wafer W is cooled to the second temperature by the combination of the first cooling section 4 and the second cooling section 5, making it possible to control highly precisely the temperature of the wafer W. As a result, the uniformity of the developing treatment is improved so as to improve the yield and, thus, to increase the yield.

Also, according to the third embodiment, the second main arm transfer mechanism A2 is used in place of the exclusive sub-arm transfer mechanism for transferring the wafer W so as to markedly diminish the foot print of the apparatus.

Further, since the wafer W is delivered from the developing unit 6 directly onto the second main arm transfer mechanism A2, the transferring path of the wafer W is simplified so as to shorten the time required for transferring the wafer W, leading to a further improved through-put.

Incidentally, in the third embodiment of the present invention, it is possible to arrange the common second cooling section 5 relative to a plurality of developing units 6.

What should also be noted is that it is possible to arrange a single heating unit H and a single cooling unit C. It is also possible to stack the heating section 3 and the first cooling section 4 in the same rack. It is also possible to form a delivery section in the heating unit H. Further, it is possible for the number of heating sections 3 to be equal to the number of first cooling sections 4. Still further, it is possible for the number of transfer arms D for transferring the wafer W between the heating section 3 and the first cooling section 4 to be equal to the number of first cooling sections 4. In addition, the heating section 3 and the first cooling section 4 may be arranged outside the treating atmosphere of the developing station S3.

Further, the particular construction of the present invention can be applied to the coating station S2. Also, the substrate to be processed is not limited to a semiconductor wafer. For example, it is possible to process a glass substrate for a liquid crystal display device in place of the semiconductor wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing apparatus for forming a pattern on a substrate by using a photolithographic process, comprising:
   a plurality of heating sections configured to heat the substrate, respectively;
   a plurality of first cooling sections, the number of which is equal to or smaller than the number of said heating sections, configured to cool the substrate heated in said heating section to a first temperature;
   a second cooling section configured to cool the substrate cooled in one of the first cooling sections to a second temperature lower than said first temperature, and
   a plurality of liquid process sections configured to supply a process liquid to the substrate cooled in said second cooling section to form a liquid film of the process liquid on the substrate.

2. The apparatus according to claim 1, further comprising:
   a first transfer mechanism configured to transfer the substrate between said heating section and said first cooling section; and
   a second transfer mechanism configured to transfer the substrate between the first cooling section and the second cooling section.

3. The apparatus according to claim 1, wherein said liquid process section includes a developing section configured to form a liquid film of the developing solution on the substrate, and said first and second cooling sections are arranged between the developing section and the heating section.

4. The apparatus according to claim 1, wherein said second cooling section is arranged so as to be surrounded by said plurality of liquid process sections such that the cooled substrate is supplied from the second cooling section to each of the plural liquid process sections.

5. The apparatus according to claim 1, wherein said second cooling section is arranged in the vicinity of one of said plural liquid process sections such that the cooled substrate is supplied to only the liquid process section arranged in the vicinity of the second cooling section.

6. The apparatus according to claim 2, further comprising a third transfer mechanism configured to transfer the substrate between the second cooling section and the liquid process section.

7. The apparatus according to claim 2, wherein said second transfer mechanism transfers the substrate between the second cooling section and the liquid process section.

8. The apparatus according to claim 1, wherein said liquid process section includes a resist coating section configured to coat the substrate surface with a resist solution, and the second cooling section is arranged in the vicinity of said resist coating section.

9. The apparatus according to claim 1, further comprising an air conditioner configured to make an atmosphere in the second cooling section substantially free from an alkali component by supplying clean air to the second cooling section.

10. A substrate processing method for forming a pattern on a substrate using a photolithographic process, comprising the steps of:
   (a) transferring a substrate into a selected one of a plurality of heating sections for heating the substrate;
   (b) transferring the substrate heated in said heating section in said step (a) into a selected one of a plurality of first cooling sections, the number of which is smaller than or equal to the number of said heating sections, for cooling the substrate to a first temperature;

(c) transferring the substrate cooled in said step (b) into a second cooling section for cooling the substrate to a second temperature lower than said first temperature; and (d) transferring the substrate cooled in said step (c) to a liquid process section for forming a liquid film of a process liquid on the substrate.

11. The method according to claim 10, wherein, in said step (d), one of said plural liquid process sections is selected and the substrate is transferred from the second cooling section into the selected liquid process section.

12. The method according to claim 10, wherein, in said step (d), the substrate is transferred from the second cooling section into a specified liquid process section.

13. The method according to claim 10, wherein said first temperature is set at 40° C. and said second temperature is set at 23° C.

14. The method according to claim 10, wherein, in said step (d), a developing solution is supplied onto the substrate under the atmosphere substantially free from an alkali component.

15. The method according to claim 10, wherein, in said step (d), the substrate is coated with a chemically amplified resist under the atmosphere substantially free from an alkali component.

* * * * *